US010418681B1

(12) United States Patent
Podell et al.

(10) Patent No.: US 10,418,681 B1
(45) Date of Patent: Sep. 17, 2019

(54) MULTILAYER LOOP COUPLER HAVING TRANSITION REGION WITH LOCAL GROUND

(71) Applicant: Werlatone, Inc., Brewster, NY (US)

(72) Inventors: Allen F. Podell, Palo Alto, CA (US); Gregory J. Pflaum, Brewster, NY (US); Ky-Hien Do, Mississauga (CA)

(73) Assignee: Werlatone, Inc., Patterson, NY (US)

(*) Notice: Subject to any disclaimer, the term of this patent is extended or adjusted under 35 U.S.C. 154(b) by 0 days.

(21) Appl. No.: 16/179,754

(22) Filed: Nov. 2, 2018

(51) Int. Cl.

| | |
|---|---|
| ***H01P 5/18*** | (2006.01) |
| ***H01P 3/08*** | (2006.01) |
| ***H01P 1/02*** | (2006.01) |
| ***H01P 3/02*** | (2006.01) |
| ***H01P 3/00*** | (2006.01) |
| *H03H 7/38* | (2006.01) |

(52) U.S. Cl.
CPC ................ *H01P 5/185* (2013.01); *H01P 1/02* (2013.01); *H01P 3/003* (2013.01); *H01P 3/026* (2013.01); *H01P 3/08* (2013.01); *H01P 5/187* (2013.01)

(58) Field of Classification Search
CPC .... H01P 5/18; H01P 5/187; H01P 3/08; H01P 1/02; H03H 7/38
USPC ................................. 333/109–112, 116–119
See application file for complete search history.

(56) References Cited

U.S. PATENT DOCUMENTS

| | | | | |
|---|---|---|---|---|
| 2,530,064 | A | 11/1950 | Jones | |
| 3,375,511 | A | 3/1968 | Trimble et al. | |
| 6,642,819 | B1 | 11/2003 | Jain et al. | |
| 6,836,207 | B2 * | 12/2004 | Nothhelfer | H01P 3/081 338/138 |
| 6,972,639 | B2 | 12/2005 | Podell | |
| 7,132,906 | B2 | 11/2006 | Podell | |
| 7,190,240 | B2 | 3/2007 | Podell | |
| 7,218,183 | B2 * | 5/2007 | Kim | H01P 3/08 333/246 |
| 7,245,192 | B2 | 7/2007 | Podell | |
| 7,990,237 | B2 | 8/2011 | Margomenos et al. | |
| 8,648,669 | B1 | 2/2014 | Podell | |

(Continued)

OTHER PUBLICATIONS

Seymour B. Cohn., The Re-Entrant Cross Section and Wide-Band 3-db Hybrid Couplers, IEEE Transactions on Microwave Theory and Techniques. IRE, vol. 46. pp. 1099-1115, Feb. 26, 1963, 5 pages.

(Continued)

*Primary Examiner* — Dean O Takaoka
(74) *Attorney, Agent, or Firm* — Kolisch Hartwell, P.C.

(57) ABSTRACT

A multilayer coupler may include electromagnetically coupled planar first and second signal conductors that are separated by a gap, extend adjacent each other along a ground plane, and change orientation in a bend. A plate may be positioned along the bend between the ground plane and the signal conductors. The ground plane may have an opening extending along the bend and the plate. A multilayer coupler may include two coupled signal conductors formed in a loop having a four-wire section in which different sections of the two signal conductors overlap in a four-wire section. In a transition region in which the coupler transitions from the four-wire section to a two-wire section, an isolating ground plane may separate the two two-wire sections extending from the four-wire section. A bend in the transition region may include a plate between the two signal conductors and the ground plane.

11 Claims, 5 Drawing Sheets

(56) References Cited

U.S. PATENT DOCUMENTS

| | | | |
|---|---|---|---|
| 8,648,675 | B1 | 2/2014 | Podell |
| 2005/0146394 | A1 | 7/2005 | Podell |

OTHER PUBLICATIONS

J.J. Taub., Re-entrant Directional Coupler Using Strip Transmission Line, IEEE Transactions on Microwave Theory and Techniques, Apr. 19, 1965, 2 pages.

Edward G. Cristal., Nonsymmetrical Coupled Lines of Reentrant Cross Section, IEEE Transactions on Microwave Theory and Techniques, May 10, 1967, 2 pages.

Anthony M. Pavio et al., A Microstrip Re-Entrant Mode Quadrature Coupler for Hybrid and Monolithic Circuit Applications, IEEE MTT-S Digest, 1990, 4 pages.

F. Masot et al., Quasi-Static and Full-Wave Analysis/Synthesis of Semi-Reentrant 3 dB Microstrip Directional Couplers, IEEE, 1992, 4 pages.

Design Equations for Broadside and Edgewise Stripline Couplers, Rogers Corporation Advanced Circuit Materials Design 3.2.1, 2003, 2 pages.

* cited by examiner

MULTILAYER LOOP COUPLER HAVING TRANSITION REGION WITH LOCAL GROUND

BACKGROUND

Two conductive lines are coupled when they are spaced apart, but spaced closely enough together for energy flowing in one to be induced in the other. The amount of energy flowing between the lines is related to the dielectric medium the conductors are in and the spacing between the lines. Even though electromagnetic fields surrounding the lines are theoretically infinite, lines are often referred to as being closely or tightly coupled, loosely coupled, or uncoupled, based on the relative amount of coupling.

Parallel transmission lines couple both electrically and magnetically. The coupling is inherently proportional to frequency, and the directivity can be high if the magnetic and electric couplings are equal.

For edge coupling between two planar conductors, it may be sufficient that the conductors have facing edges, such as for coplanar conductors, and for broadside coupling, it may be sufficient that the conductors have facing broad surfaces.

Unless ferrite or other high permeability materials are used, greater than octave bandwidths at higher frequencies are generally achieved through cascading couplers. In a uniform long coupler the coupling rolls off when the length exceeds one-quarter wavelength, and an octave bandwidth is typical for +/−0.3 dB coupling ripple. If three equal length couplers are connected as one long coupler, with the two outer sections being equal in coupling and much weaker than the center coupling, a wideband design results. At low frequencies all three couplings add. At higher frequencies the three sections can combine to give reduced coupling at the center frequency, where each coupler is one-quarter wavelength. This design may be extended to many sections to obtain a very large bandwidth.

Two characteristics exist with the cascaded coupler approach. One is that the coupler becomes very long and lossy, since its combined length is more than one-quarter wavelength long at the lowest band edge. Further, the coupling of the center section gets very tight, especially for 3 dB multi-octave couplers. A cascaded coupler of X:1 bandwidth is about X quarter wavelengths long at the high end of its range.

SUMMARY

In some embodiments, a multilayer coupler may include a ground plane; and planar first and second signal conductors. The first and second signal conductors are electromagnetically closely coupled together in at least first, second, and third coupled sections distributed serially along the first and second signal conductors and forming a substantially closed loop when viewed normal to the loop. A four-conductor section may be formed by the first coupled section overlapping the third coupled section when viewed normal to the loop. The second coupled section is electrically disposed between the first and third coupled sections. The first and second signal conductors may form a transition region proximate the four-conductor section in which the first and second signal conductors extend from the first coupled section in the loop and the first and second signal conductors extend from the third coupled section out of the loop. The ground plane may be disposed in the transition region between (i) the first and second signal conductors extending from the first coupled section and (ii) the first and second signal conductors extending from the third coupled section.

In some embodiments, the first and second signal conductors may change orientation in a bend in the transition region from a first orientation extending along a first line to a second orientation extending along a second line transverse to the first line. The multilayer coupler may further include an electrically conductive planar plate physically positioned along the bend in the transition region between and spaced from (i) the ground plane and (ii) the first and second signal conductors. In some examples, the plate is not metallically connected to the ground plane or either of the first and second signal conductors. Further, the ground plane may have an opening extending along the first and second signal conductors in the bend in alignment with the plate when viewed normal to the ground plane.

Features, functions, and advantages may be achieved independently in various embodiments of the present disclosure, or may be combined in yet other embodiments, further details of which can be seen with reference to the following description and drawings.

DESCRIPTION

Figure 1:
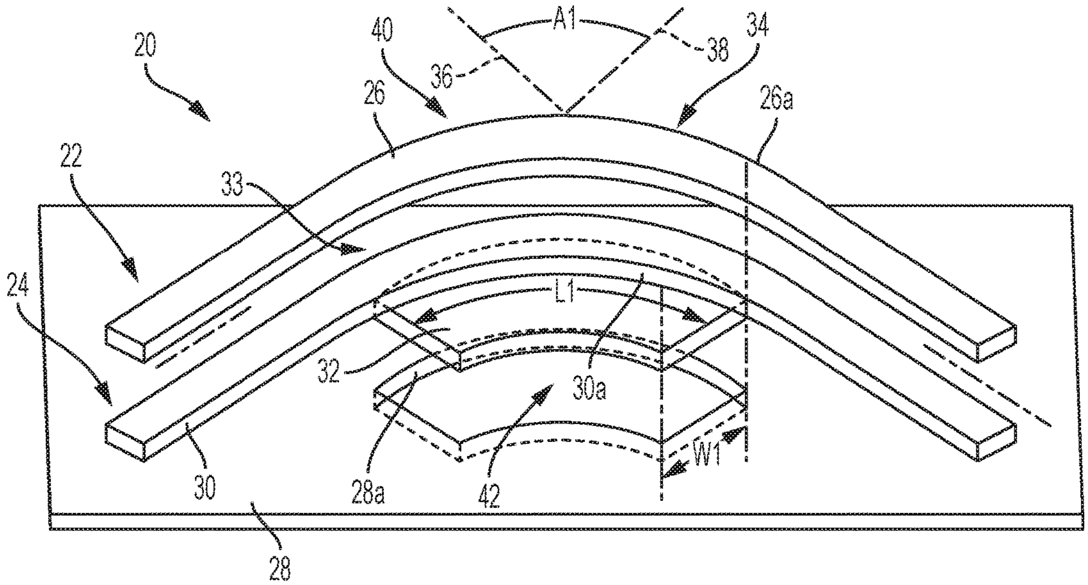
FIG. 1 is a general isometric diagram showing an exemplary compensated bend in coupled planar strip conductors of a planar transmission line.

Various embodiments of planar transmission lines having coupled signal lines or conductors that are shielded or compensated, such as in a transition region that may include a bend, are described below and illustrated in the associated drawings. Unless otherwise specified, a coupler, including a portion of a coupler having coupled lines, and/or various components of such structures may, but are not required to, contain at least one of the structure, components, functionality, and/or variations described, illustrated, and/or incorporated herein. Furthermore, the structures, components, functionalities, and/or variations described, illustrated, and/or incorporated herein in connection with the present teachings may, but are not required to, be included in other couplers of structures having coupled conductors. The following description of various embodiments is merely exemplary in nature and is in no way intended to limit the disclosed exemplary subject matter, its application, or uses. Additionally, the advantages provided by the embodiments, as described below, are illustrative in nature and not all embodiments provide the same advantages or the same degree of advantages.

Two coupled lines may be analyzed based on odd and even modes of propagation. For a pair of identical lines, the even mode exists with equal voltages applied to the inputs of the lines, and for the odd mode, equal out-of-phase voltages. This model may be extended to non-identical lines, and to multiple coupled lines. For high directivity in a 50-ohm system, for example, the product of the characteristic impedances of the odd and even modes, e.g., Zoe*Zoo is equal to $Zo^2$, or 2500 ohms. Zo, Zoe, and Zoo are the characteristic impedances of the coupler, the even mode and the odd mode, respectively. Moreover, the more equal the velocities of propagation of the two modes are, the better the directivity of the coupler.

The odd mode of propagation is as a balanced transmission line. In order to have the even and odd mode velocities equal, the even mode needs to be slowed down by an amount equal to the reduction in velocity introduced by any dielectric loading of the odd mode. The coupling between portions of the spiral modifies the low pass structure into a nearly all-pass "T" section. When the electrical length of the spiral is large enough, such as greater than one-eighth of a design center frequency, the spiral may not be considered to function as a lumped element. As a result, it may be nearly all-pass. The delay of the nearly all pass even mode and that of the balanced dielectrically loaded odd mode may be made approximately equal over a decade bandwidth.

Spirals or other loops may also increase the even-mode impedance for a couple of reasons. One reason is that the capacitance to ground may be shared among multiple conductor portions. Further, magnetic coupling between adjacent conductors raises their effective inductance. A loop line is also smaller than a straight line, and easier to support without impacting the even mode impedance very much.

In compact designs used to form a loop for example, coupled planar transmission lines curve or meander through one or more bends. Magnetic coupling between the layers may be strongly affected by the bends, while the capacitive coupling is largely unaffected. The result is that even mode impedance changes more than odd mode impedance around the bend. A four wire section in which the loop conductors overlap in a section providing both edge coupling and broadside coupling helps to balance the coupling throughout the loop. The addition of the second traces substantially restores much of the coupling to the same level as that in the straight portions of the coupler. This allows one to bend or meander a tightly coupled pair of lines. Providing improved balance in the coupling in the bends however reduces the need for increased coupling in other parts of the coupler.

In the following description, two major faces or broad sides of coupled conductors may be considered facing, for instance, if a line can be drawn directly between a major face of each one. Correspondingly, two major faces may be considered overlapping if a line normal to the major face of one conductor intersects a major face of another. These surfaces may be considered to be completely overlapping if an entire major face is overlapping with the other major face. Surfaces may thus be facing each other without being overlapping or directly opposite each other. Two planar conductors that face each other, thus, may be non-overlapping, partially overlapping, or completely overlapping.

The amount of coupling may be defined by a coupling coefficient. However, as a practical measure, two lines may be considered to be inductively coupled when a detectable or measurable signal is coupled from one line onto the other. A threshold of coupling may be appropriate to distinguish between coupled and uncoupled lines. In most applications, two lines that have less than 20 dB inductive coupling between them are considered to be loosely coupled or uncoupled lines. In some applications, lines that have less than 100 dB are considered to be uncoupled lines. Correspondingly, lines having coupling above these values may be considered to be tightly coupled lines. Coupled lines or conductors of couplers are considered to be tightly coupled unless otherwise indicated.

In general, a multilayer coupler may include two planar coupled conductors that bend along a plane of the coupler with compensation for even-mode propagation along the bend provided by a floating-potential plate extending around at least a first portion of the bend and generally parallel to the conductors. A ground plane disposed on a side of the plate opposite from the conductors has an opening also extending around at least a second portion of the bend at least partially in alignment with the plate. This opening may increase the distance between the ground and the conductors in the bend where even-mode coupling is compromised. The floating-potential plate increases coupling between the conductors, compensating for coupling losses in the bend.

Referring now to FIG. 1, a first embodiment of a multilayer coupler, shown generally at 20, is illustrated. Coupler 20 includes planar first and second transmission lines 22, 24. First transmission line 22 includes a signal conductor 26, also referred to as a line, and a ground plane 28. Second transmission line 24 includes a signal conductor 30 and ground plane 28. Transmission lines 22, 24 are illustrated as microstrip lines, but may take other planar configurations, such a striplines. A floating-potential plate 32 is disposed between the combination of conductors 26, 30 and ground plane 28. Plate 32 has a floating potential in that it is not metallically connected to another electrically conductive element having an externally applied signal, voltage, or electric potential, including conductors 26, 30 and ground plane 28.

Conductors 26, 30, ground plane 28, and plate 32 are preferably electrically conductive, planar structures that are disposed in respective spaced-apart parallel planes or layers separated by appropriate dielectric layers, not shown. Conductors 26, 30 are separated by a gap 33 providing a predetermined amount of coupling between the conductors.

The conductors may be coplanar, in which case they are edge coupled, or they may be disposed on different spaced-apart planes, in which case they may be broadside coupled or both broadside and edge coupled.

Conductors 26, 30 turn through a bend 34, such as a curve in which the conductors transition from an orientation in which they extend along a line 36 to an orientation in which they extend along a line 38. The term "bend" as used herein refers to any transition of conductors from an orientation along one line to a different orientation along another line. Lines 36, 38 are typically transverse to each other, being related by an angle A1, although they may also be parallel. Angle A1 may be between 0 degrees and 360 degrees, depending on the coupler configuration. In the example shown, angle A1 is about 90 degrees.

Bend 34 may define or be included in a transition region 40 in which the conductors change orientation from line 36 to line 38. Plate 32 is disposed in transition region 40 and generally extends along bend 34 in alignment with conductors 26, 30.

Plate 32 has a width between opposite sides. In the example shown, plate 32 has a generally uniform width W1 along a length L1 extending along the conductors. Width W1 of plate 32 preferably is wider than or at least as wide as a combined-conductor width between opposite laterally more distal edges of a combination of the first and second conductors in the transition region when viewed normal to the first plane. In other words, width W1 also corresponds to a dimension parallel to ground plane 28 that extends from an outer conductor edge 26*a* of conductor 26 to opposite, distal outer conductor edge 30*a* of conductor 30.

Ground plane 28 has a void defined by inner ground-plane edge 28*a* that forms an opening 42 generally aligned with plate 32 and conductors 26, 30 in bend 34. In this example, opening 42 has a configuration corresponding to plate 32 with a width W1 and a length L1, commensurate with the extent of bend 34 in transition region 40.

Plate 32 and opening 42 may have various respective configurations that are the same or different, depending on the application, and preferably extend lengths L corresponding to at least a portion of a length of bend 34, as shown. Plate 32 may have a length in either direction, or both directions, along conductors 26, 30 extending beyond the ends of the bend, and correspondingly beyond the ends of the opening in ground plane 28. In some examples, the first opening is wider than the combined-conductor width. In some examples, the plate is wider than the first opening.

Figure 2:
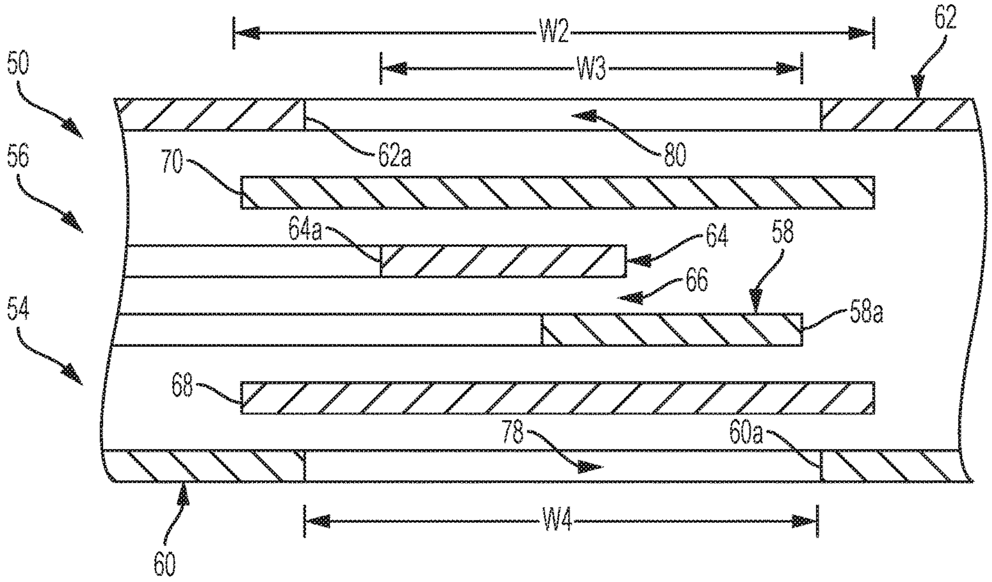
FIG. 2 is a simplified cross section taken along line 2-2 of FIG. 8 showing six layers of an exemplary compensated stripline bend illustrated in FIGS. 3-8.
Figure 3:
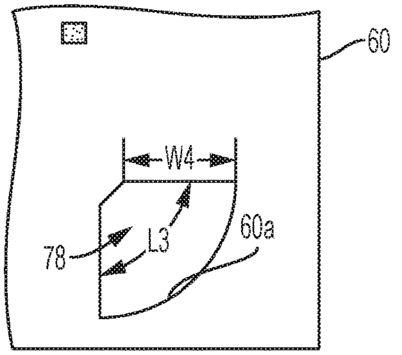
FIG. 3 is a plan view of a bottom ground plane as layer 1 of the exemplary compensated stripline bend illustrated in FIG. 2.
Figure 4:
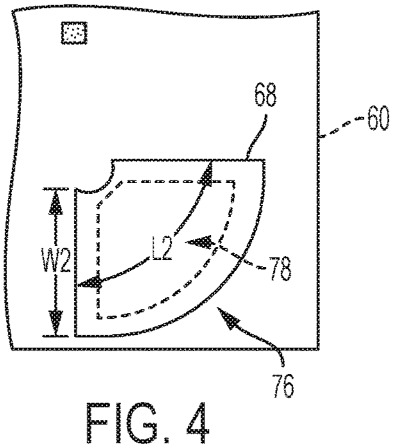
FIG. 4 is a plan view of a first floating-potential plate as layer 2 of the exemplary compensated stripline bend illustrated in FIG. 2.
Figure 5:
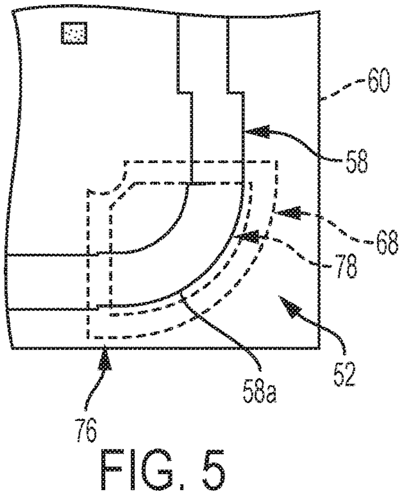
FIG. 5 is a plan view of a first strip conductor as layer 3 of the exemplary compensated stripline bend of FIG. 2.
Figure 6:
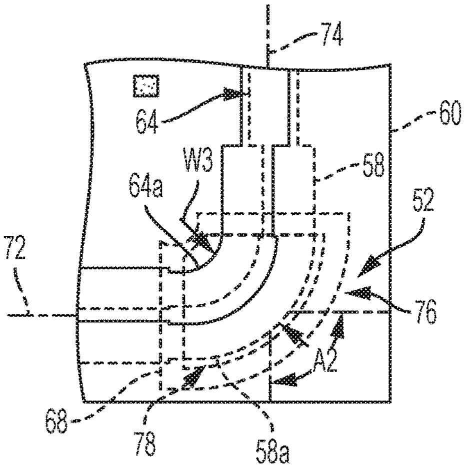
FIG. 6 is a plan view of a second strip conductor as layer 4 of the exemplary compensated stripline bend of FIG. 2.

FIGS. 2-8 illustrate a second embodiment of a coupler, shown generally at 50, having a compensated bend 52. Coupler 50 is an example of coupler 20 shown in FIG. 1. FIG. 2 is a cross-section taken across bend 52 along line 2-2 in FIG. 8 and FIGS. 3-8 are plan views of each of six spaced-apart layers of metallization forming coupler 50. Coupler 50 includes planar first and second striplines 54, 56. First stripline 52 includes a signal conductor 58, also referred to as a line, and first and second opposite ground planes 60, 62. Second stripline 56 includes a signal conductor 64 and ground planes 60, 62. A first or bottom ground plane 60 is illustrated as layer 1, shown in FIG. 3. Signal conductor 58 is illustrated in FIG. 5 as layer 3. Signal conductor 64 is illustrated in FIG. 6 as fourth layer 4. Ground plane 62 is a second or top ground plane shown in FIG. 8 as layer 6, which figure is also a plan view of coupler 50 with other, lower layers shown in dashed lines.

Conductors 58, 64 are separated by a gap 66. The conductors may be coplanar, in which case they are edge coupled, or they may be disposed on different spaced-apart planes, in which case they may be broadside coupled or a combination of edge-coupled and broadside coupled. As particularly shown in FIG. 2, in this example conductors 58, 64 are disposed on spaced-apart planes separated by gap 66 and are partially overlapping. The conductors are, therefore, both edge coupled and broadside coupled.

A first floating-potential plate 68 is disposed between ground plane 60 and conductor 58, and a second floating-potential plate 70 is disposed between ground plane 62 and conductor 64. Conductors 58, 64, ground planes 60, 62, and plates 68, 70 are generally planar structures that are disposed in respective spaced-apart parallel planes or layers separated by appropriate dielectric layers, not shown. Plates 68, 70 have floating potentials in that they are not metallically connected to another electrically conductive element, such as conductors 58, 64 and ground planes 60, 62, having an externally applied signal, voltage, or electric potential.

As shown in FIG. 6, conductors 58, 64 turn through bend 52, such as a curve, in which the conductors transition from an orientation in which they extend along a line 72 to an orientation in which they extend along a line 74. In this example, bend 52 is a 90-degree curve and lines 72, 74 therefore form an angle A2 of 90 degrees.

Bend 52 may define or be included in a transition region 76 in which the conductors change orientation from line 72 to line 74. Plates 68, 70 are disposed in transition region 76 and extend along bend 52 in alignment with conductors 58, 64.

Figure 7:
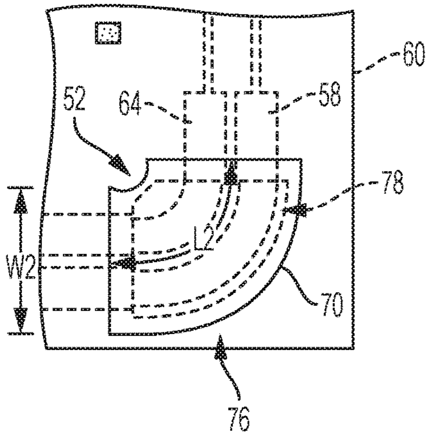
FIG. 7 is a plan view of a second floating-potential plate as layer 5 of the exemplary compensated stripline bend of FIG. 2.
Figure 8:
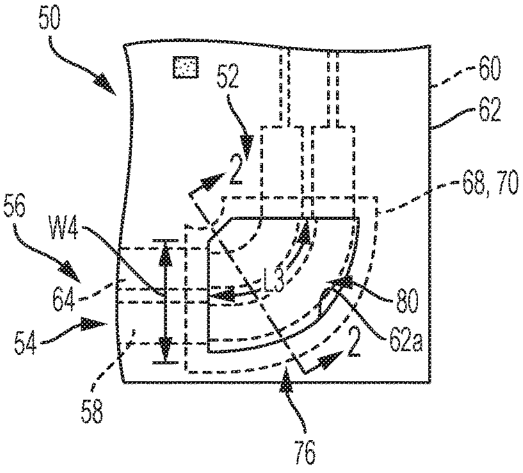
FIG. 8 is a plan view of a top ground plane as layer 6 of the exemplary compensated stripline bend illustrated in FIG. 2, which view corresponds to a plan view of the stripline bend of FIG. 2.

Plates 68, 70 may be the same, as shown in the plan views of these plates in FIGS. 4 and 7. Plates 68, 70 have widths between opposite sides. In the example shown, plates 68, 70 have generally uniform widths W2 along lengths L2 extending along the line of the conductors in bend 52. In this example, widths W2 of plates 68, 70 are wider than a combined-conductor width W3 between opposite laterally more distal edges of a combination of first and second conductors 58, 64 in transition region 76 when viewed normal to the plane of the conductors as shown in FIGS. 5, 6. In other words, width W3 corresponds to a dimension parallel to ground planes 60, 62 that extends from an outer conductor edge 58*a* of conductor 58 to opposite, distal outer conductor edge 64*a* of conductor 64, as shown in FIG. 6. In this example, lengths L2 of the plates are longer than the lengths L3 of conductors 58, 64 forming bend 52, with the plates extending beyond ends of the bend.

Ground planes 60, 62 each has a void defined by respective inner ground-plane edges 60*a*, 62*a* that forms respective openings 78, 80 generally aligned with plates 68, 70 and conductors 58, 64 in bend 52. In this example, openings 78, 80 have configurations following bend 52 and are smaller than plates 68, 70 in width and length, commensurate with the extent of bend 52 in transition region 76. Specifically in this example, openings 78, 80 have lengths L3 that are the same as the length of bend 52 along conductors 58, 64, and widths W4 that are wider than the combined conductor width W3, but not as wide as plate widths W2. Accordingly, plates 68, 70 have lengths L2 that are longer than opening lengths L3.

From the above, it will be seen that couplers 20, 50 each include a ground plane, electromagnetically coupled planar first and second signal conductors spaced from and parallel to the ground plane, and an electrically conductive planar plate. The plate is physically positioned between and spaced from the ground plane and the signal conductors in a transition region in which the conductors form a bend. The signal conductors are separated by a gap, extend adjacent each other along the ground plane, and change orientation along a bend in the transition region from a first orientation extending along a first line to a second orientation extending along a second line transverse to the first line. The plate is not metallically connected to the ground plane or either of the signal conductors. Also, the ground plane has an opening extending along the bend in the signal conductors in the transition region in alignment with the plate when viewed normal to the ground plane.

Figure 9:
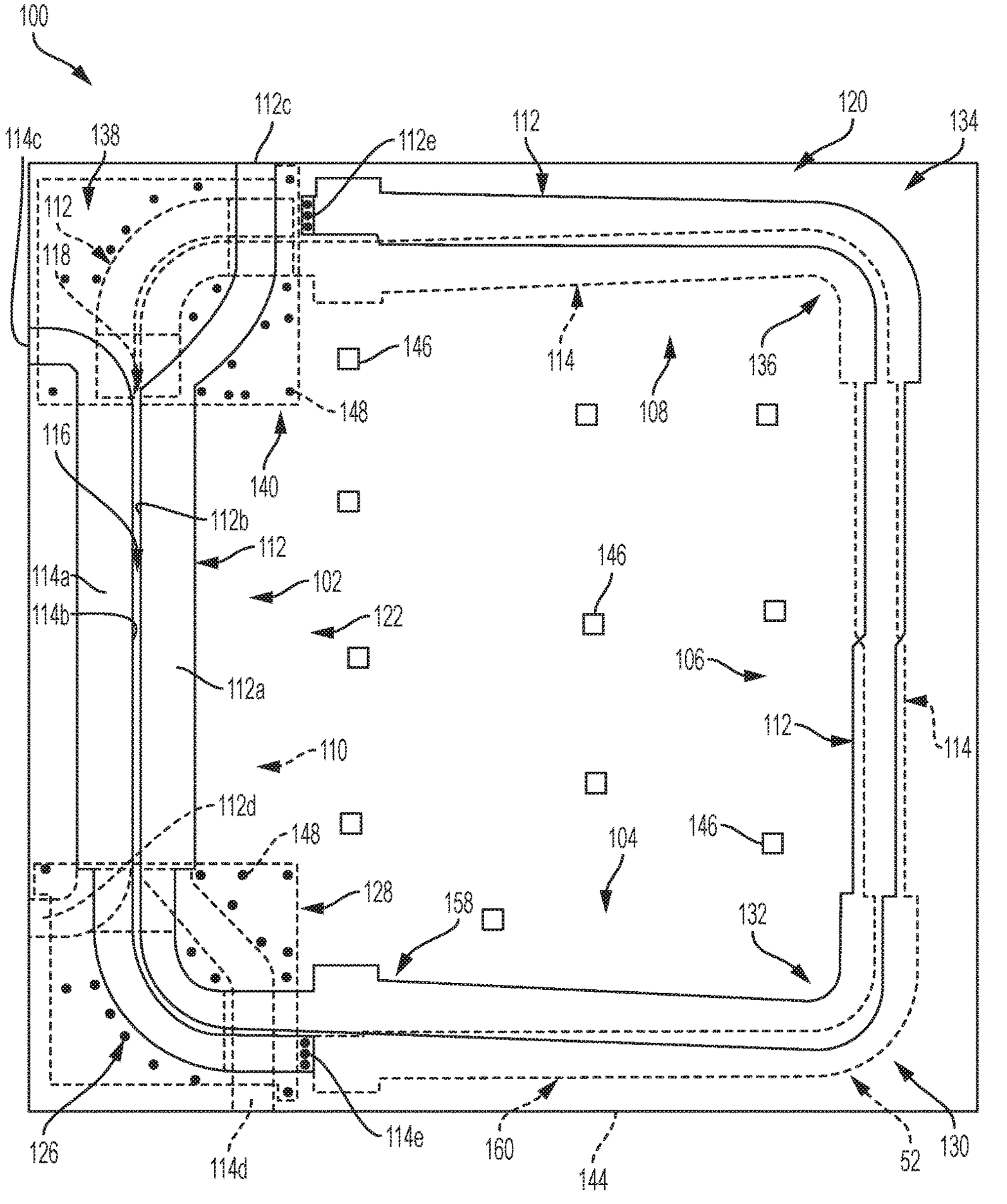
FIG. 9 is a plan view of an exemplary quadrature hybrid coupler having compensated bends.

FIG. 9 depicts an exemplary multilevel planar quadrature hybrid coupler 100 that may be made with features similar to features of couplers 20, 50. Coupler 100 includes two-conductor coupled sections 102, 104, 106, 108, and 110 formed by at least a pair of conductors, such as signal conductors 112, 114 of associated planar transmission lines. In this example, the coupled sections are of equal electrical length and have respective lengths that are a quarter of a design frequency wavelength. The coupler has a pass band centered at the design frequency and, in this example, includes five quarter-wavelength coupled sections.

Conductors 112, 114 may be strip conductors, and have broad, major faces on opposite sides, such as faces 112*a*, 114*a*, and edges connecting the broad faces, such as edges 112*b*, 114*b*. Conductor 112 has opposite ends 112*c*, 112*d* that may be considered as two ports of coupler 100. Similarly, conductor 114 has opposite ends 114*c*, 114*d* that may be considered as the other two ports of coupler 100. In this example, different portions of both of conductors 112, 114 are disposed on two levels, which levels may correspond to conductor planes or layers, and/or dielectric surfaces.

The conductors further include interconnects, such as vias, that interconnect conductor portions on different levels. More specifically, an interconnect 114*e* interconnects coupled sections 102, 104 of conductor 114. Similarly, an interconnect 112*e* interconnects coupled sections 108, 110 of conductor 112.

Conductors 112, 114 are disposed on one of two conductor layers or levels of coupler 100. Conductor 112 is on an upper or first conductor layer of the two conductors, as shown by solid lines in FIG. 9, in coupled sections 102, 104, 106, and 108. Conductor 112 is on a lower or second conductor layer of the two conductors in coupled section 110. Conductor 114 is on the upper layer of coupled section 102 and on the lower layer, as shown by dashed lines in FIG. 9, in coupled sections 104, 106, 108, and 110.

Figure 11:
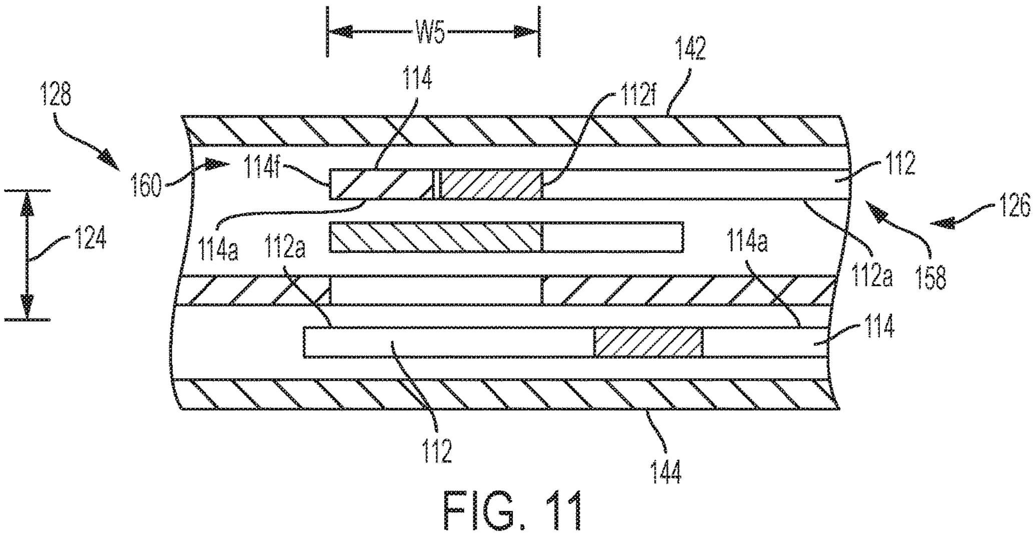
FIG. 11 is a simplified cross section taken along line 11-11 in FIG. 10 showing six layers of the exemplary compensated bend of FIG. 10.
Figure 12:
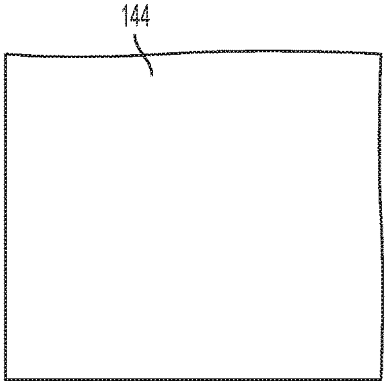
FIG. 12 is a plan view of a bottom ground plane as layer 1 of the exemplary compensated bend of FIG. 10.

Conductors 112, 114 are separated by respective gaps 116, 118 between adjacent edges 112*b*, 114*b* in coplanar coupled sections 102, 110. The conductors are coplanar in coupled sections 102, 110 and, accordingly, are edge coupled. The conductors in coupled section 102 are both on the upper or first layer. The conductors transition from being non-overlapping in coupled section 102, to partial overlapping in coupled section 104, and to predominantly, though not completely overlapping in coupled section 106. Similarly, the conductors transition from predominantly overlapping in coupled section 106, in which conductors 112, 114 are separated by a gap 124 between the conductor layers as is shown in FIG. 11, to partial overlapping in section 108, and to non-overlapping in coupled section 110. The conductors in coupled section 110 are both on the lower, or second conductor layer. It is seen that the overlapping transitions progressively from non-overlapping in coupled sections 102, 110 to maximum overlapping in the center of coupled section 106.

It will also be seen that conductors 112, 114 form a coupler loop 120 with the conductors overlapping in coupled sections 102, 110. The positions of the two conductors relative to the center of the loop transition from being on the inside of the loop in one of coupled sections 102, 110 to being on the outside of the loop in the other of coupled sections 102, 110. This results in the combination of coupled sections 102, 110 forming what may be considered a four-conductor or four-wire coupled section 122. In four-conductor coupled section 122, each conductor is coupled to the other three conductors, is edge coupled to the other conductor in the same two-conductor coupled section 102 or 110, and broadside coupled to the other conductor in the other of the two two-conductor coupled sections.

In this example, coupled sections 102, 104, 106, 108, 110 are each primarily straight, being separated by bends, with each bend forming a transition region. Specifically, a bend 126 forms a transition region 128 connecting coupled sections 102, 104. Transition region 128 further includes a transition from four-conductor section 122 to two-conductor section 104 in which conductors 112, 114 from coupled section 110 connect to conductor ends 112*d*, 114*d*, as further described with reference to FIGS. 10-17. A bend 130 forms a transition region 132 connecting coupled sections 104, 106. A bend 134 forms a transition region 136 connecting coupled sections 106, 108. A bend 138 forms a transition region 140 connecting coupled sections 108, 110. Transition region 140 further includes a transition from two-conductor section 108 to four-conductor section 122 in which conductors 112, 114 from coupled section 102 connect to respective conductor ends 112*c*, 114*c*. These bends contribute to and are part of the associated respective coupled sections.

Transition region 128 is described in further detail in FIGS. 10-17. Transition region 140 is structurally the same as transition region 128, but flipped over so the structural elements are reversed in layer position and a mirror image. Similarly, transition regions 132, 136 are similar, but with the conductor layers reversed. All of transition regions 128, 132, 136, 140 may be structured with compensated bends, such as bends 34, 52 of couplers 20, 50 described previously. As will be seen, bends 126, 138 are structured similar to bend 34, and bend 52 may be considered an alternative embodiment of bends 130, 134 (with the appropriate change in relative positions of conductors 112, 114 in bend 134).

Coupler 100 also includes opposite ground planes 142, 144, as shown in FIG. 11. General vias 146 interconnect the ground planes. Local vias 148 interconnect ground planes in transition regions 128, 140, as is described further below with reference to FIG. 10.

Figure 10:
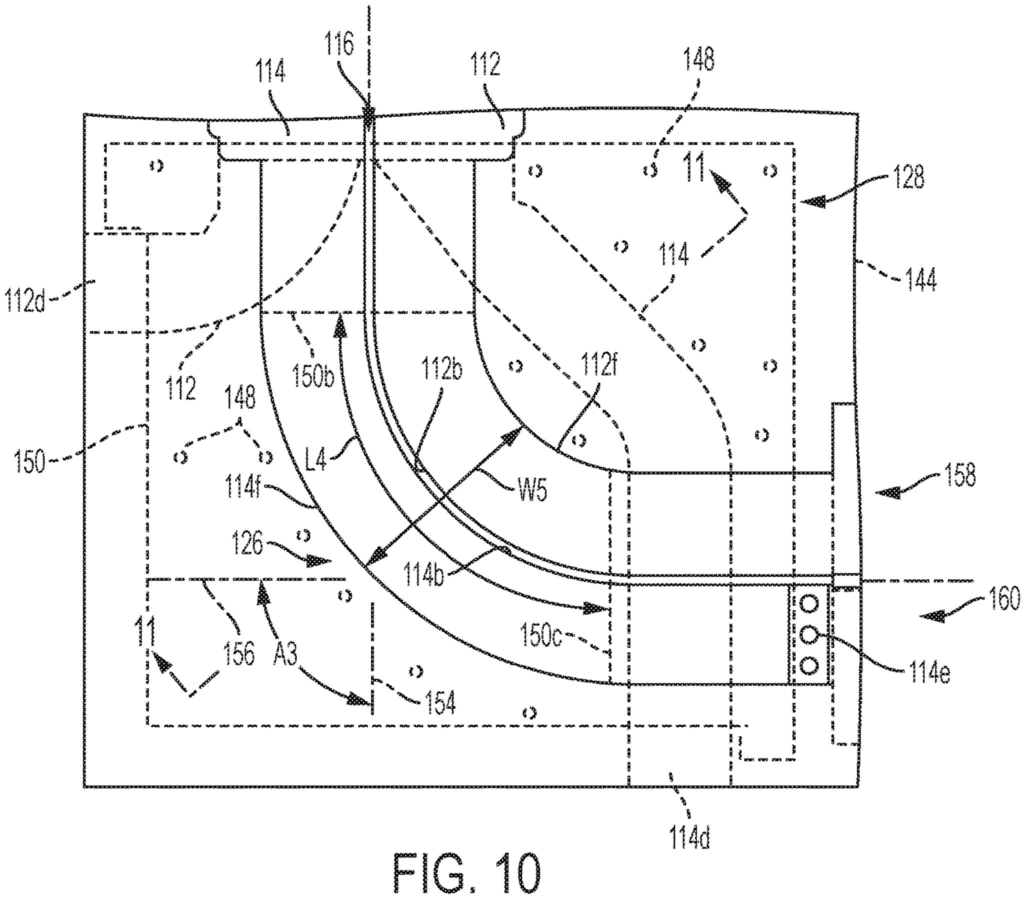
FIG. 10 is an enlarged view of one of the exemplary compensated bends of the coupler of FIG. 9.
Figure 13:
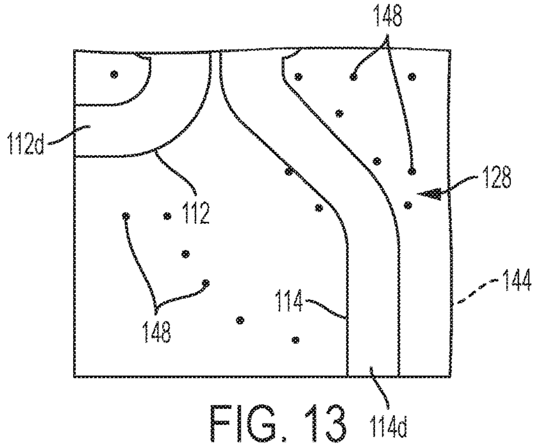
FIG. 13 is a plan view of coplanar end portions of first and second strip conductors as layer 2 of the exemplary compensated bend of FIG. 10.

FIG. 11 is a cross section taken along line 11-11 in FIG. 10 showing metallization layers in transition region 128, and particularly in bend 126. FIGS. 12-17 show plan views of each layer beginning with bottom ground plane 144 in a first layer in FIG. 12 and ending with top ground plane 142 in FIG. 17. Immediately above ground plane 144 in a second layer are conductors 112, 114 transitioning from coupled section 110 in four-conductor coupled section 122 to respective spaced-apart conductor ends or ports 112*d*, 114*d*, as shown in FIG. 13.

Figure 14:
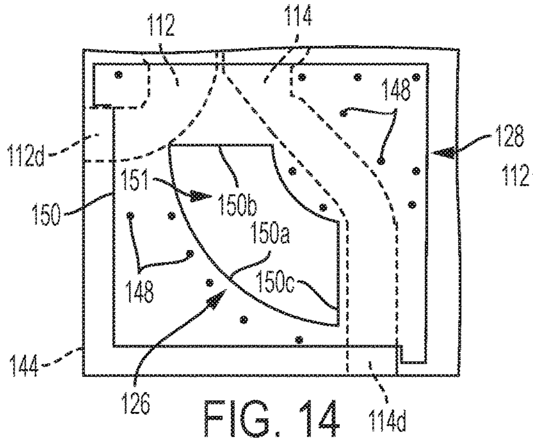
FIG. 14 is a plan view of a local ground plane as layer 3 of the exemplary compensated bend of FIG. 10.

Immediately above conductors 112, 114 in layer third is a local ground plane 150 that extends across transition region 128 between the straight portions of coupled sections 102, 104, as is shown in FIG. 14. Local ground plane 150 is connected to general ground plane 144 by vias 148. A curved opening 151 in local ground plane 150 is defined by ground-plane edge 150*a* that conforms to bend 126 in conductors 112, 114 between coupled sections 102, 104.

Figure 15:
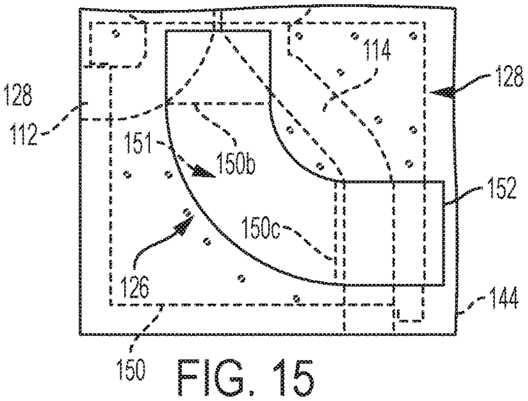
FIG. 15 is a plan view of a floating-potential plate as layer 4 of the exemplary compensated bend of FIG. 10.

Immediately above local ground plane 150 in a fourth layer, as shown in FIG. 15, is a floating-potential plate 152 positioned between the combination of conductors 112, 114 extending between coupled sections 102, 104 and local ground plane 150. Plate 152 has a floating potential in that it is not metallically connected to another electrically conductive element having an externally applied signal, voltage, or electric potential, including conductors 112, 114 and ground planes 142, 144, 150.

Figure 16:
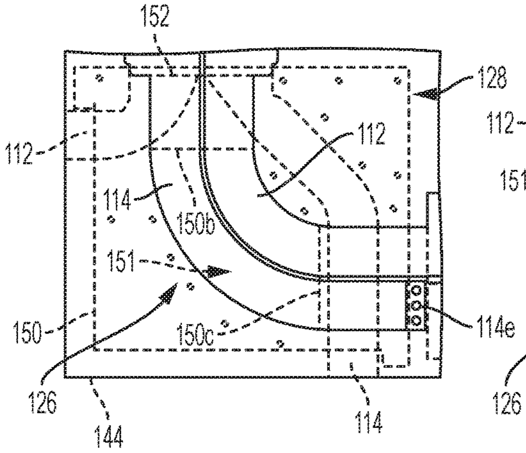
FIG. 16 is a plan view of coplanar bend portions of the first and second strip conductors as layer 5 of the exemplary compensated bend of FIG. 10.
Figure 17:
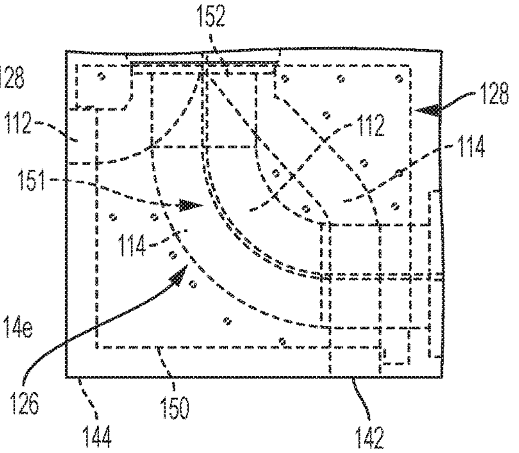
FIG. 17 is a plan view of a top ground plane as layer 6 of the exemplary compensated bend of FIG. 10.

As shown in FIGS. 10 and 16, in layer five conductors 112, 114 form bend 126 interconnecting coupled sections 102, 104. As particularly shown in FIG. 10, conductors 112, 114 extend along a rectilinear or straight line 154 in coupled section 102 and extend along a straight line 156 in coupled section 104. The orientation of conductors 112, 114 in layer 5 transitions from line 154 to line 156 in bend 126 of transition region 128, changing orientation by an angle A3 of 90 degrees in the plane of layer five, which as is the case with all of the layers, parallel with the plane of ground plane 142.

Immediately above layer five is layer six containing general ground plane 142, which like ground plane 144, extends along the entirety of loop 120. Conductors 112, 114 thus are signal conductors of respective striplines 158, 160.

It is seen that transition region 28 includes bend 126 of conductors 112, 114 in layer five between coupled sections 102, 104, but also the transition of conductors 112, 114 out of loop 120 between coupled section 110 and ports 112*d*, 114*d*. As also shown in FIG. 10, local ground plane 150 extends between conductors 112, 114 in layer two and conductors 112, 114 in layer five, separating and isolating the two portions of the conductors, rendering them relatively uncoupled in the transition region.

Conductors 112, 114 in bend 126 have a combined outside width W5 between outer conductor edges 112*f*, 114*f*. Plate 152 and local-ground-plane opening 151 also have a width W5 along bend 126 and conform with the shape of conductors 112, 114 when viewed normal to the plane of conductors 112, 114 in bend 126, which is the plane of view of FIGS. 10 and 16. Local-ground-plane opening 151 has ends coincident with opposite local ground plane edges 150*b*, 150*c* and has a length L4 between the opening ends. Opening 151 is aligned and conforms with bend 126 of conductors 112, 114 and so bend 126 has corresponding ends and a length L4. Floating potential plate 152 also is aligned and conforms with conductors 112, 114 in transition region 128, also having a width W5. However, Plate 152 extends along lines 154, 156 beyond the ends of bend 126 to a position near to corresponding edges of local ground plane 150, as shown in FIG. 10. Transition region 128 thus includes a compensating bend structure like the bend structure of coupler 20 shown in FIG. 1.

This section describes additional aspects and features of a coupler having a compensated bend and/or isolation between conductors transitioning from a four-conductor coupled section to a two-conductor coupled section disclosed in the figures and described above. Some of these aspects and features are presented without limitation as a series of paragraphs that are alphanumerically designated for clarity and efficiency. Each of these paragraphs can be combined with one or more other paragraphs, and/or with disclosure from elsewhere in this application, in any suitable manner. Some of the paragraphs below expressly refer to and further limit other paragraphs, providing without limitation examples of some of the suitable combinations.

A1.A multilayer coupler comprising a first ground plane; electromagnetically coupled planar first and second signal conductors spaced from and parallel to the first ground plane, wherein the first and second signal conductors are separated by a gap, extend adjacent each other along the first ground plane, and change orientation in a bend from a first orientation extending along a first line to a second orientation extending along a second line transverse to the first line; and an electrically conductive planar first plate physically positioned adjacent to the bend and between and spaced from (i) the first ground plane and (ii) the first and second signal conductors, wherein the first plate is not metallically connected to the first ground plane or either of the first and second signal conductors; wherein the first ground plane has a first opening extending along the first and second signal conductors in alignment with the bend and the first plate when viewed normal to the first ground plane.

A2. The multilayer coupler of paragraph A1, wherein the bend has a length along the first and second signal conductors and the first opening extends the length of the bend.

A3.The multilayer coupler of paragraph A1, wherein the first opening has an opening width along the length of the first opening that is at least as wide as a combined-conductor width between opposite laterally more distal edges of a combination of the first and second conductors in the bend when viewed normal to the first plane.

A4.The multilayer coupler of paragraph A2,wherein the first opening is wider than the combined-conductor width.

A5. The multilayer coupler of paragraph A1, wherein the first plate has a length along the first and second signal conductors that is at least as long as a length of the first opening along the first and second signal conductors.

A6.The multilayer coupler of paragraph A5, wherein the first plate is longer than the first opening along the first and second signal conductors.

A7. The multilayer coupler of paragraph A5, wherein the first plate is wider than the first opening along the first and second signal conductors.

A8. The multilayer coupler of paragraph A1, wherein the first plate extends along the first and second signal conductors beyond the bend.

A9. The multilayer coupler of paragraph A1, wherein the first plate extends along the first and second signal conductors beyond the first opening.

A10. The multilayer coupler of paragraph A9, wherein the bend has opposite ends along the first and second signal conductors and the first plate extends along the first and second signal conductors beyond both ends of the bend.

A11. The multilayer coupler of paragraph A1, further comprising a planar second ground plane and an electrically conductive second plate, wherein the second ground plane is spaced from, parallel to, and electrically connected to the first ground plane, the first and second conductors and the first plate are disposed between the first and second ground planes; the second plate is physically positioned between and spaced from the second ground plane and the first and second signal conductors, extends along the bend, and is not metallically connected to the first or second ground planes, the first plate, or either of the first and second signal conductors; and the second ground plane has a second opening extending along the first and second conductors in the bend in alignment with the second plate when viewed normal to the first ground plane.

A12. The multilayer coupler of paragraph A11, wherein the second plate is aligned with the first plate when viewed normal to the first ground plane.

A13. The multilayer coupler of paragraph A12, wherein the second plate is the same size as the first plate when viewed normal to the first ground plane.

A14. The multilayer coupler of paragraph A11, wherein the second opening is aligned with the first opening when viewed normal to the first ground plane.

A15. The multilayer coupler of paragraph A14, wherein the second opening is the same size as the first opening when viewed normal to the first ground plane.

A16. The multilayer coupler of paragraph A1, wherein the first and second conductors are disposed on respective spaced-apart planes parallel to the first ground plane.

A17. The multilayer coupler of paragraph A1, further comprising electromagnetically coupled planar third and fourth signal conductors extending proximate to the bend and parallel to the first ground plane, wherein the first ground plane is disposed in a plane extending between the first and second signal conductors and the third and fourth signal conductors.

A18. The multilayer coupler of paragraph A17, wherein the third and fourth signal conductors do not extend in alignment with the first opening when viewed normal to the plane of the first ground plane.

A19. The multilayer coupler of paragraph A17, where the third conductor is a continuation of the first conductor and the fourth conductor is a continuation of the second conductor, and the first and second conductors each form a loop.

A20. The multilayer coupler of paragraph A17, further comprising a second ground plane electrically connected to, parallel to, and spaced from the first ground plane, wherein the third and fourth conductors extend between the first and second ground planes.

B1. A multilayer coupler comprising a first ground plane; planar first and second signal conductors electromagnetically closely coupled together in at least first, second, and third coupled sections distributed serially along the first and second signal conductors and forming a substantially closed loop when viewed normal to the loop with a four-conductor section formed by the first coupled section overlapping the third coupled section when viewed normal to the loop; wherein the second coupled section is electrically disposed between the first and third coupled sections; the first and second signal conductors form a transition region proximate the four-conductor section in which the first and second signal conductors extend from the first coupled section in the loop and the first and second signal conductors extend from the third coupled section out of the loop; and the first ground plane is disposed in the transition region between (i) the first and second signal conductors extending from the first coupled section and (ii) the first and second signal conductors extending from the third coupled section.

B2.The multilayer coupler of paragraph B1, wherein the first and second signal conductors change orientation in a bend in the transition region from a first orientation extending along a first line to a second orientation extending along a second line transverse to the first line; the multilayer coupler further comprises an electrically conductive planar plate physically positioned along the bend in the transition region between and spaced from (i) the first ground plane and (ii) the first and second signal conductors, wherein the plate is not metallically connected to the first ground plane or either of the first and second signal conductors; and wherein the first ground plane has an opening extending along the first and second signal conductors in the bend in alignment with the plate when viewed normal to the first ground plane.

B3. The multilayer line coupler of paragraph B2, wherein the bend in the first and second signal conductors has a length along the first and second signal conductors and the opening extends the length of the first and second signal conductors in the bend.

B4. The multilayer line coupler of paragraph B2, wherein the opening has an opening width along the length of the opening that is at least as wide as a combined-conductor width between opposite laterally more distal edges of a combination of the first and second conductors in the bend when viewed normal to the first ground plane.

B5. The multilayer line coupler of paragraph B3, wherein the opening is wider than the combined-conductor width.

B6. The multilayer coupler of paragraph B2, wherein the plate has a length along the first and second signal conductors that is at least as long as a length of the opening along the first and second signal conductors.

B7. The multilayer coupler of paragraph B6, wherein the plate is longer than the opening along the first and second signal conductors.

B8. The multilayer coupler of paragraph B6, wherein the plate is wider than the opening along the first and second signal conductors.

B9. The multilayer coupler of paragraph B2, wherein the plate extends along the first and second signal conductors beyond the bend.

B10. The multilayer coupler of paragraph B2, wherein the plate extends along the first and second signal conductors beyond the opening.

B11. The multilayer coupler of paragraph B10, wherein the bend has opposite ends along the first and second signal conductors and the first plate extends along the first and second signal conductors beyond both ends of the bend.

The different embodiments of the couplers described herein provide several advantages over known solutions for achieving balanced coupling. Couplers like coupler 100 with loop 120 and four-conductor section 122 are practical to construct and use. The loop reduces the coupling in the tightest coupling section, broad-sided coupling section 106, to a level that is realizable using normal PCB stripline traces. Four-conductor section 122 allows that loop to be formed in a convenient configuration. Broad-sided coupling section 106 is linked to edge-coupled sections 102, 110 in four-conductor section 122. The four-conductor section also includes all four ports of the coupler, namely one input port, two output ports, and the isolated port.

However, the two corners where the four-conductor coupled section transitions to the broad-sided section are delicate and typically a cause of issues in terms of bandwidth and power performance. A local ground plane at each of the two corners adjacent to the four-conductor section separates the top two conductors from the bottom two conductors. The local ground plane preferably has an opening along the path where the top (or bottom) two edge-coupled conductors turn the corner at a bend. This opening brings the ground away from the conductors in the bend where even-mode coupling is substantially affected. A floating shield positioned between the opening in the local ground plane in alignment with the edge-coupled two conductors increases coupling otherwise lost in the bend. This compensating structure maintains a wide bandwidth otherwise achieved with the coupler, even though it involves a more complicated printed circuit board (PCB) stack-up and layout.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. To the extent that section headings are used within this disclosure, such headings are for organizational purposes only, and do not constitute a characterization of any claimed invention. The subject matter of the invention(s) includes all novel and nonobvious combinations and subcombinations of the various elements, features, functions, and/or properties disclosed herein. The following claims particularly point out certain combinations and subcombinations regarded as novel and nonobvious. Invention(s) embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the invention(s) of the present disclosure.

Where "a" or "a first" element or the equivalent thereof is recited, such usage includes one or more such elements, neither requiring nor excluding two or more such elements. Further, ordinal indicators, such as first, second, or third, for identified elements are used to distinguish between the elements in the order in which they are introduced, and do not indicate a required or limited number of such elements, and do not indicate a particular position or order of such elements unless otherwise specifically indicated. Accordingly, the ordinal indicator used for a particular element may vary in different contexts.

The invention claimed is:

1. A multilayer coupler comprising:

a first ground plane;

planar first and second signal conductors electromagnetically closely coupled together in at least first, second, and third coupled sections distributed serially along the first and second signal conductors and forming a substantially closed loop when viewed normal to the loop with a four-conductor section formed by the first coupled section overlapping the third coupled section when viewed normal to the loop;

wherein the second coupled section is electrically disposed between the first and third coupled sections;

the first and second signal conductors form a transition region proximate the four-conductor section in which the first and second signal conductors extend from the first coupled section in the loop and the first and second signal conductors extend from the third coupled section out of the loop; and the first ground plane is disposed in the transition region between (i) the first and second signal conductors extending from the first coupled section and (ii) the first and second signal conductors extending from the third coupled section.

2. The multilayer coupler of claim 1, wherein the first and second signal conductors change orientation in a bend in the transition region from a first orientation extending along a first line to a second orientation extending along a second line transverse to the first line;

the multilayer coupler further comprises an electrically conductive planar plate physically positioned along the bend in the transition region between and spaced from (i) the first ground plane and (ii) the first and second signal conductors, wherein the plate is not metallically connected to the first ground plane or either of the first and second signal conductors; and wherein the first ground plane has an opening extending along the first and second signal conductors in the bend in alignment with the plate when viewed normal to the first ground plane.

3. The multilayer line coupler of claim 2, wherein the bend in the first and second signal conductors has a length along the first and second signal conductors and the opening extends the length of the first and second signal conductors in the bend.

4. The multilayer line coupler of claim 2, wherein the opening has an opening width along the length of the opening that is at least as wide as a combined-conductor width between opposite laterally more distal edges of a combination of the first and second conductors in the bend when viewed normal to the first ground plane.

5. The multilayer line coupler of claim 3, wherein the opening is wider than the combined-conductor width.

6. The multilayer coupler of claim 2, wherein the plate has a length along the first and second signal conductors that is at least as long as a length of the opening along the first and second signal conductors.

7. The multilayer coupler of claim 6, wherein the plate is longer than the opening along the first and second signal conductors.

8. The multilayer coupler of claim 6, wherein the plate is wider than the opening along the first and second signal conductors.

9. The multilayer coupler of claim 2, wherein the plate extends along the first and second signal conductors beyond the bend.

10. The multilayer coupler of claim 2, wherein the plate extends along the first and second signal conductors beyond the opening.

11. The multilayer coupler of claim 10, wherein the bend has opposite ends along the first and second signal conductors and the first plate extends along the first and second signal conductors beyond both ends of the bend.

* * * * *